(12) United States Patent
Mosley et al.

(10) Patent No.: US 7,242,073 B2
(45) Date of Patent: Jul. 10, 2007

(54) CAPACITOR HAVING AN ANODIC METAL OXIDE SUBSTRATE

(75) Inventors: Larry E. Mosley, Santa Clara, CA (US); Cengiz A. Palanduz, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 310 days.

(21) Appl. No.: 10/925,428

(22) Filed: Aug. 24, 2004

(65) Prior Publication Data

US 2005/0136609 A1 Jun. 23, 2005

Related U.S. Application Data

(63) Continuation-in-part of application No. 10/746,767, filed on Dec. 23, 2003, now Pat. No. 7,019,346.

(51) Int. Cl.
*H01L 29/00* (2006.01)
(52) U.S. Cl. ................ 257/532; 257/E23.144
(58) Field of Classification Search ........ 257/532, 257/E23.144
See application file for complete search history.

(56) References Cited

U.S. PATENT DOCUMENTS

| | | | |
|---|---|---|---|
| 6,262,877 B1 * | 7/2001 | Mosley | 361/306.2 |
| 6,515,325 B1 * | 2/2003 | Farnworth et al. | 257/296 |
| 6,775,126 B2 * | 8/2004 | Fujii et al. | 361/523 |
| 6,800,886 B2 * | 10/2004 | Awano | 257/276 |
| 6,819,001 B2 * | 11/2004 | Burdick et al. | 257/778 |
| 6,828,786 B2 * | 12/2004 | Scherer et al. | 324/300 |
| 6,842,328 B2 * | 1/2005 | Schott et al. | 361/302 |
| 6,858,891 B2 * | 2/2005 | Farnworth et al. | 257/296 |
| 6,891,319 B2 * | 5/2005 | Dean et al. | 313/309 |
| 6,891,724 B2 * | 5/2005 | De Lorenzo et al. | 361/704 |
| 6,917,514 B2 * | 7/2005 | Mido et al. | 361/533 |
| 2004/0087102 A1 * | 5/2004 | Nagai et al. | 438/396 |

FOREIGN PATENT DOCUMENTS

EP 1 310 966 A1 * 5/2006

OTHER PUBLICATIONS

Lu et al., "Synthesis and characterization of conducting copolymer nanofibrils of pyrrole and 3-methylthiophene using the template-synthese method," Materials Science and Engineering A334, 2002, pp. 291-297.

Peng et al., "Magnetic properties and magnetization reversal of -Fe nanowires deposited in alumina film," J. of Applied Physics, vol. 87, No. 10, May 15, 2000, pp. 7405-7408.

* cited by examiner

*Primary Examiner*—Mary Wilczewski
*Assistant Examiner*—Toniae M. Thomas
(74) *Attorney, Agent, or Firm*—Schwabe, Williamson & Wyatt, P.C.

(57) ABSTRACT

In one embodiment, a structure and method including an anodic metal oxide substrate used to form a capacitor are described herein.

12 Claims, 10 Drawing Sheets

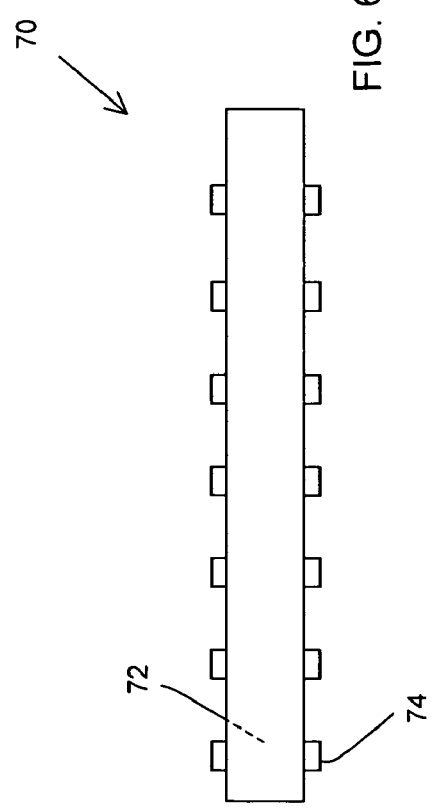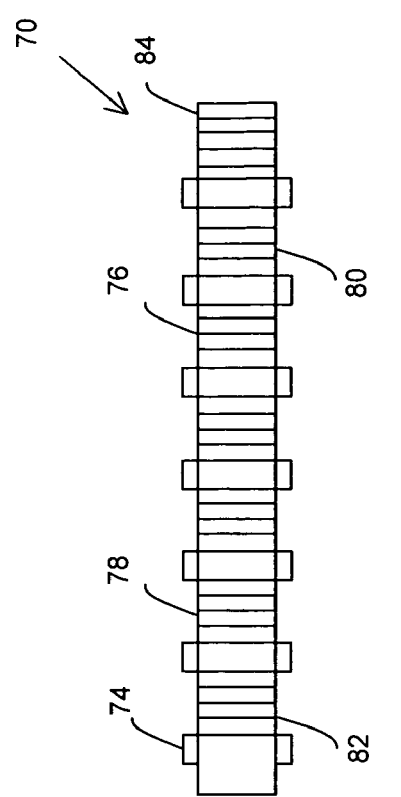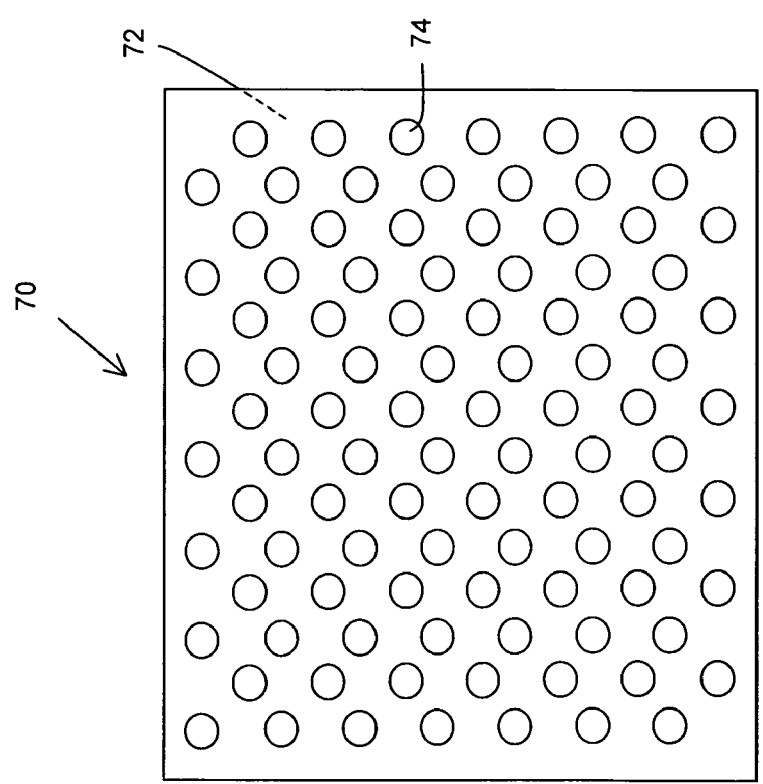

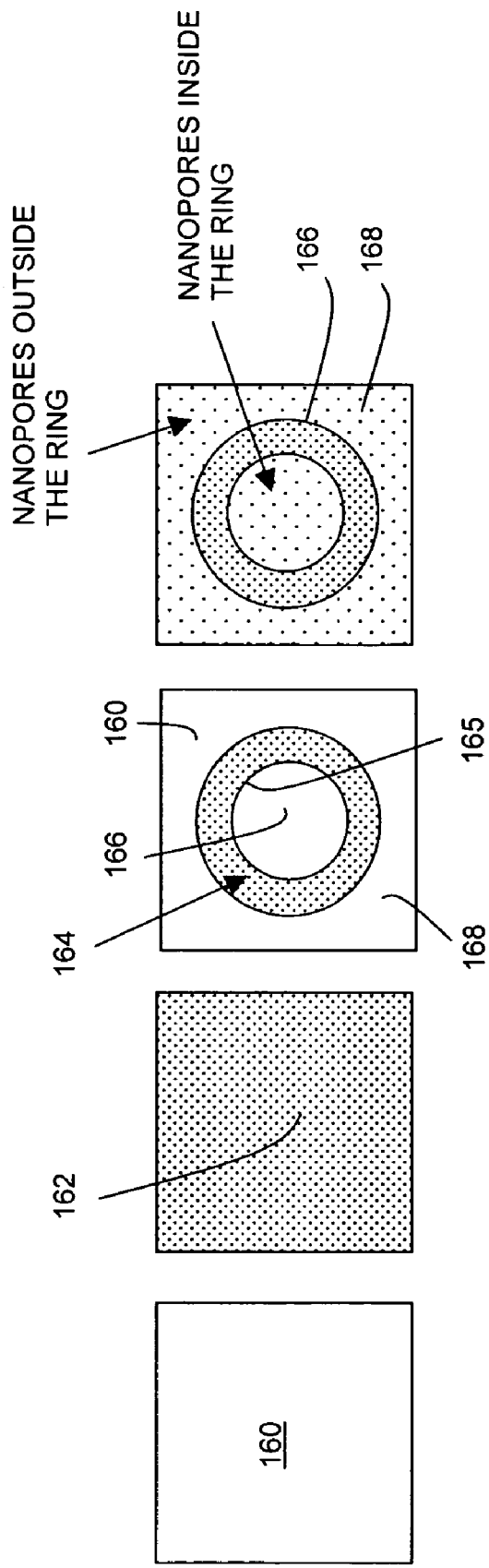

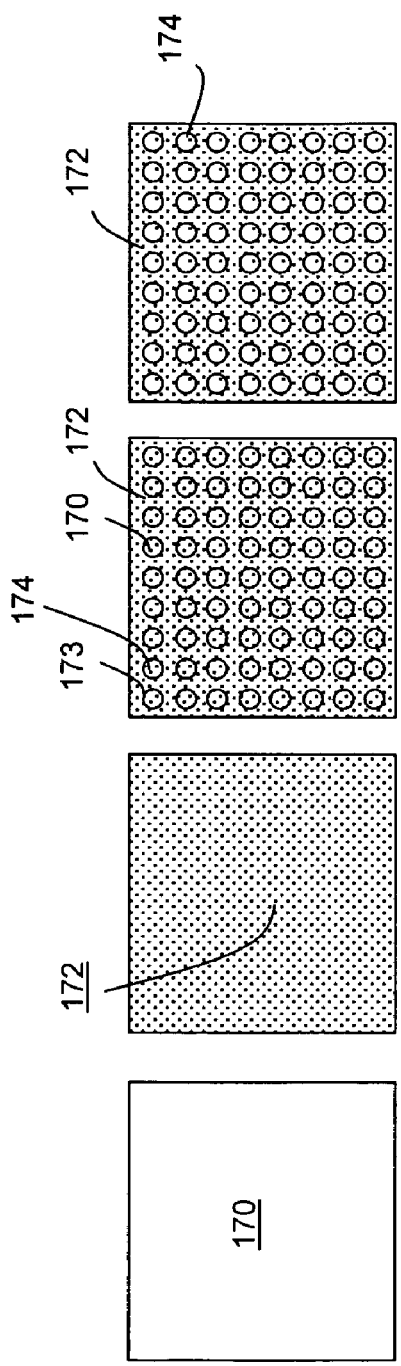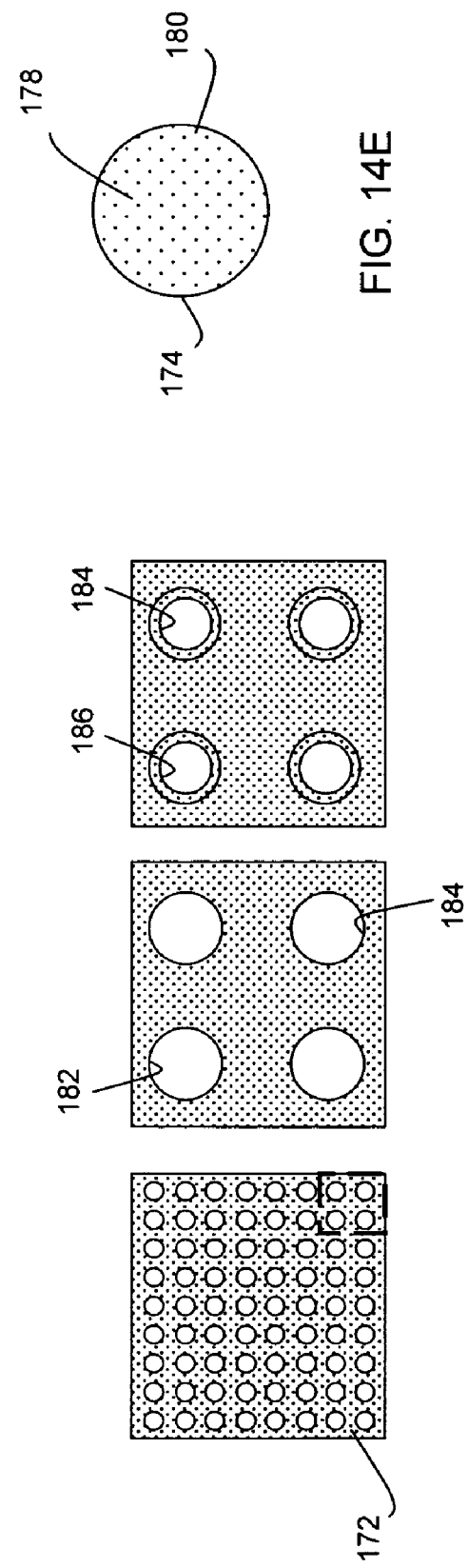

CAPACITOR HAVING AN ANODIC METAL OXIDE SUBSTRATE

CROSS-REFERENCE TO RELATED APPLICATIONS

This application is a continuation-in-part of U.S. patent application Ser. No. 10/746,767, filed Dec. 23, 2003 now U.S. Pat. No. 7,019,346, entitled "A Capacitor having an Anodic Metal Oxide Substrate", and claims priority to the '767 application.

BACKGROUND

1. Technical Field

Embodiments of the present invention are related to the field of electronic devices, and in particular, to capacitors.

2. Description of Related Art

Anodic Aluminum Oxide (AAO) substrates and their formation have been described in the literature (e.g. Peng et. al., J. Of Applied Physics, Vol. 87, p7405, 2000). These AAO substrates have been used as templates in growing or forming nanowires (also referred to as nanofibrils). Many of these nanowires are formed of metal (e.g. Peng et. al., J. of Applied Physics, Vol. 87, p7405, 2000) or electrically conductive polymers (e.g. Lu et. al., Materials Science and Engineering, A334, p291, 2002). In the literature the MO substrates have then been used as sacrificial templates to form nanowires within their nanopores (also referred to as nanotubes). After the formation of the nanowires, the AAO templates are dissolved away using a NaOH solution leaving only the nanowires.

BRIEF DESCRIPTION OF THE DRAWINGS

FIG. 5 is a top view of an AMO substrate with protective coating to be used in forming an array capacitor, in accordance with another embodiment of the present invention.

FIG. 6 is a side view of the AMO substrate of FIG. 5.

FIG. 7 is a cross sectional, side view of an AMO substrate of FIGS. 5 and 6 which shows a plurality of nanopores and nanowires.

FIGS. 13A-13D illustrates a process for forming input/output signal vias for the AMO capacitor interposer of FIG. 12.

FIGS. 14A-14H illustrate an alternative fabrication process for making the various capacitor embodiments according to the present invention and also includes an alternative process for forming the input/output signal vias for the AMO capacitor interposer of FIG. 12.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

In accordance with one embodiment of the invention, an Anodic Metal Oxide (AMO) substrate may be used as a template to form a high density capacitor, referred to as an AMO capacitor. In general, this topology uses the AMO substrate to provide a template for forming nanowires, so as to make the high density capacitor. FIGS. 1-4 provide a basic topology for making the capacitor, which may provide a basis of several applications. As one example of an application, this topology may be used to form a high density array capacitor using the AMO substrate, as discussed with respect to FIGS. 5-11. As an example of another application, this topology may be used to form a low profile, high density capacitor interposer using the AMO substrate, as discussed with respect to FIG. 12. As an example of yet another application, this topology may be used to form a laminate interposer capacitor using the AMO substrate, as discussed with respect to FIG. 15. Other applications of this topology for forming capacitors are possible.

Figure 1B:
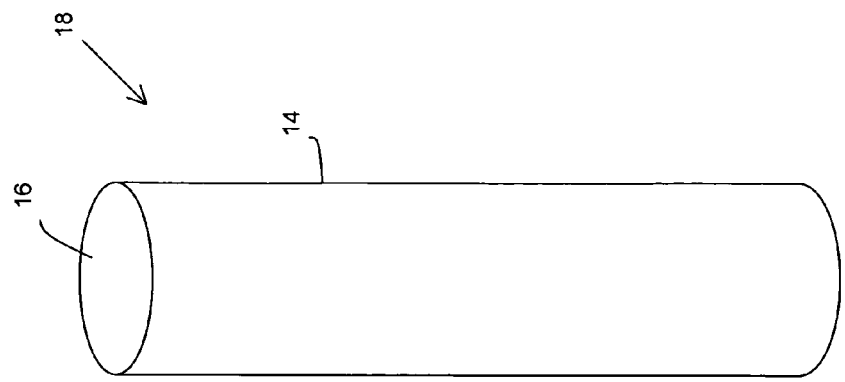
FIG. 1B is an enlarged side view of one of a plurality of nanopores formed in the AMO substrate of FIG. 1A.
Figure 1A:
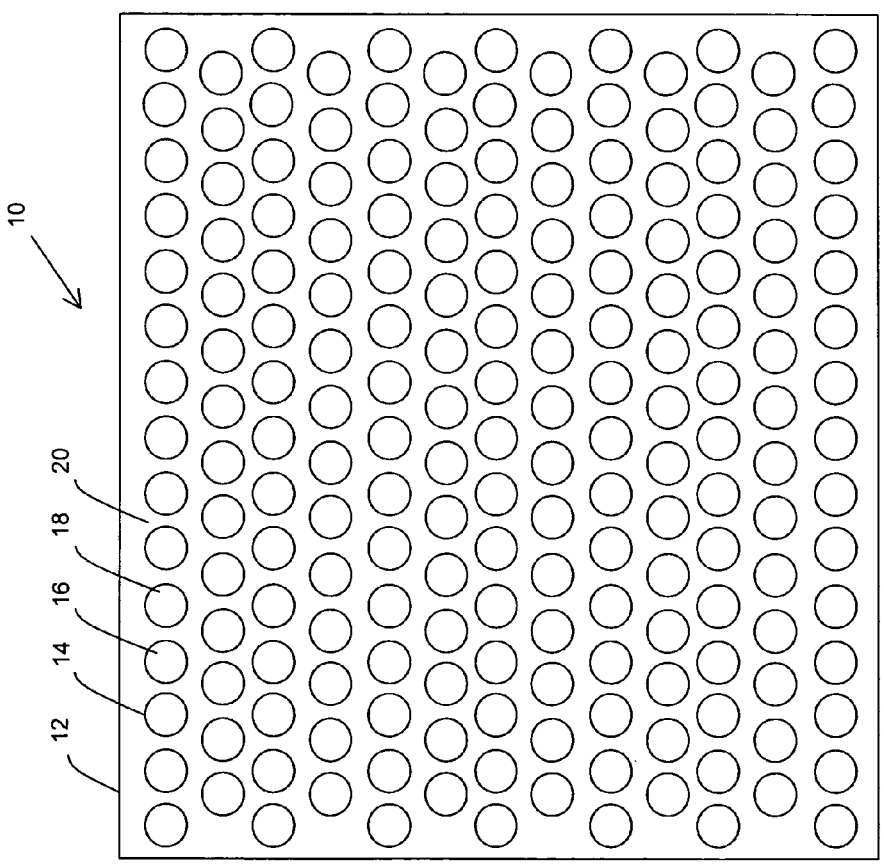
FIG. 1A is a top view of an (anodic Metal Oxide) AMO substrate.

With reference to FIG. 1A, an AMO substrate 10 is shown which includes an anodized metal plate 12. The anodization process causes a plurality of nanopores 14 to be formed in the anodized metal plate 12. In one embodiment the anodized metal plate 12 is formed from aluminum; hence, in this embodiment the AMO substrate 10 may be described as being an Anodic Aluminum Oxide (AAO) substrate and the anodized metal plate 12 may be described as an aluminum plate. However, the description Anodic Metal Oxide (AMO) is used instead of AAO, because metals other than aluminum also may be used for the AMO substrate 10 and the plate 12. More specifically, it is contemplated that other metals, such as titanium or tungsten, may be used to form the AMO substrate 10 and the anodized metal plate 12, in which case even larger capacitance densities may be achieved due to their higher relative dielectric constants.

Referring to FIGS. 1A and 1B, there is shown a plurality of nanopores 14, with each nanopore having a wall 16 with a substantially circular cross-section. The nanopores 14 form a plurality of columns 18. The anodizing process may result in the formation of a plurality of hexagonal arrays of the columns 18, although any configuration of the columns may be used with the capacitors in accordance with the embodiments of the present invention. These columns 18 may be disposed in perpendicular relationship to a surface 20 of the substrate 10. The nanopores 14 may have diameters ranging from 10's to 100's of nanometers, with similar spacing and lengths of up to 10's of microns. The density of the nanopores 14 may be on the order of $10^{10}$ to $10^{11}$ per $cm^2$. One of the columns 18 is shown in more detail in an enlarged side view of FIG. 1B.

Figure 2:
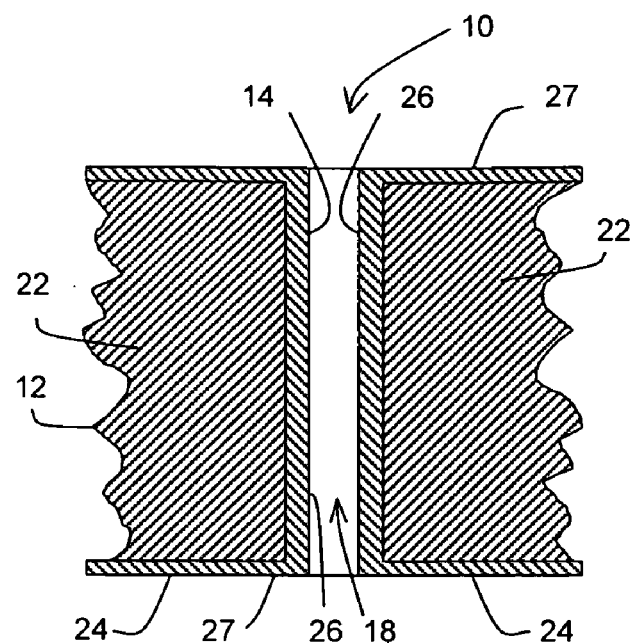
FIG. 2 is a fragmented, enlarged cross-sectional view of the AMO substrate of FIG. 1A showing an oxide layer grown thereon and a nanopore.

Referring to FIG. 2, a fragmented enlarged portion of the AMO substrate 10 is shown to show the effects by the anodization process on the AMO substrate 10. As a result of the anodization process, the anodized metal plate 12 includes a core metal plate 22, the plurality of nanopores 14, and a thin, insulating, conformal oxide layer 24 formed over the surfaces of the core metal plate 22, including the walls of the nanopores 14. That part of the oxide layer 24 in the nanopores 14 may be referred to as a sidewall oxide layer 26. That part of the oxide layer 24 on the top and bottom sides of the core metal plate 22 may be referred to as outer oxide layer 27. The sidewall oxide layer 26 and the outer oxide layer 27 are integral portions of the oxide layer 24 that is formed during the anodization process. In FIG. 2, only a single column 18 of a single nanopore 14 of the plurality of nanopores is shown in this fragment view. In summary, the anodization process forms both the nanopores 14 and the oxide layer 24.

Figure 3:
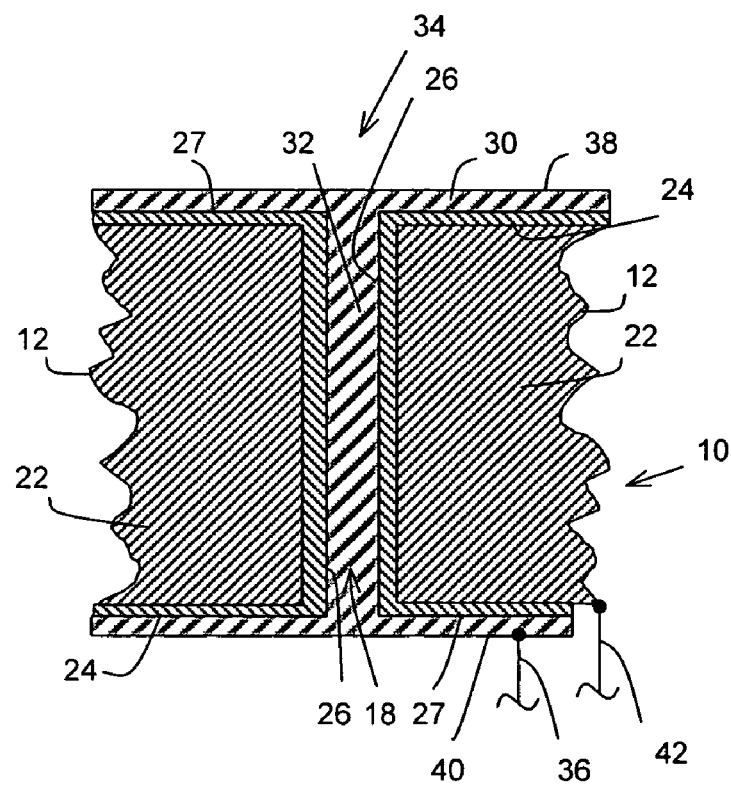
FIG. 3 is a fragmented, enlarged cross-sectional view of the AMO substrate of FIG. 3 having nanowires deposited in the nanopores to form a capacitor, in accordance with one embodiment of the invention.

Referring to FIG. 3, a cross-section of the nanopore 14 within the AMO substrate 10 is shown filled with a deposited conductive material 30, such as a conductive metal or an electrically conductive polymer. That portion of the conductive material 30 filling each of the nanopores 14 defines a nanowire 32. The conductive material 30 may cover the oxide layer 24 of the anodized metal plate 12, with the nanopores 14 being completely filled. More specifically, the conductive material may cover the outer oxide layer 27 and the plurality of sidewall oxide layers 26 of the plurality of nanopores 14. This structure defines a capacitor 34, i.e., an AMO capacitor. More specifically, the core metal plate 22 may act as one terminal (i.e., anode) of a capacitor 34; the oxide layer 24 may form a dielectric layer of the capacitor 34; and the conductive material 30 (which includes the nanowires 32) may act as the other terminal (i.e., cathode) of the capacitor 34. Making a first electrical connection 36 to the terminal formed by the conductive material 30 (i.e., cathode) may readily be accomplished by any number of ways, e.g., electrical contact with one of a top conductive layer 38 or bottom conductive layer 40 of the conductive material 30, which is distributed on the outer oxide layer 27 on the top and bottom sides of the core metal plate 22. The top and bottom conductive layers 38 and 40 of the conductive material 30 may electrically interconnect all the nanowires 32 formed in the AMO substrate 10. To establish a second electrical connection 42 to the core metal plate 22 may be accomplished either by masking off or otherwise preventing parts of the core metal plate 22 from being anodized, or alternatively, by further processing after the anodization of the core metal plate 22 to expose areas of the core metal plate 22. With these electrical connections, the AMO substrate 10 has two conductive layer paths and thereby providing capacitance via the capacitor 34 between the conductive layer paths when an electric potential (not shown) is applied to the first and second connections 36 and 42.

Figure 4:
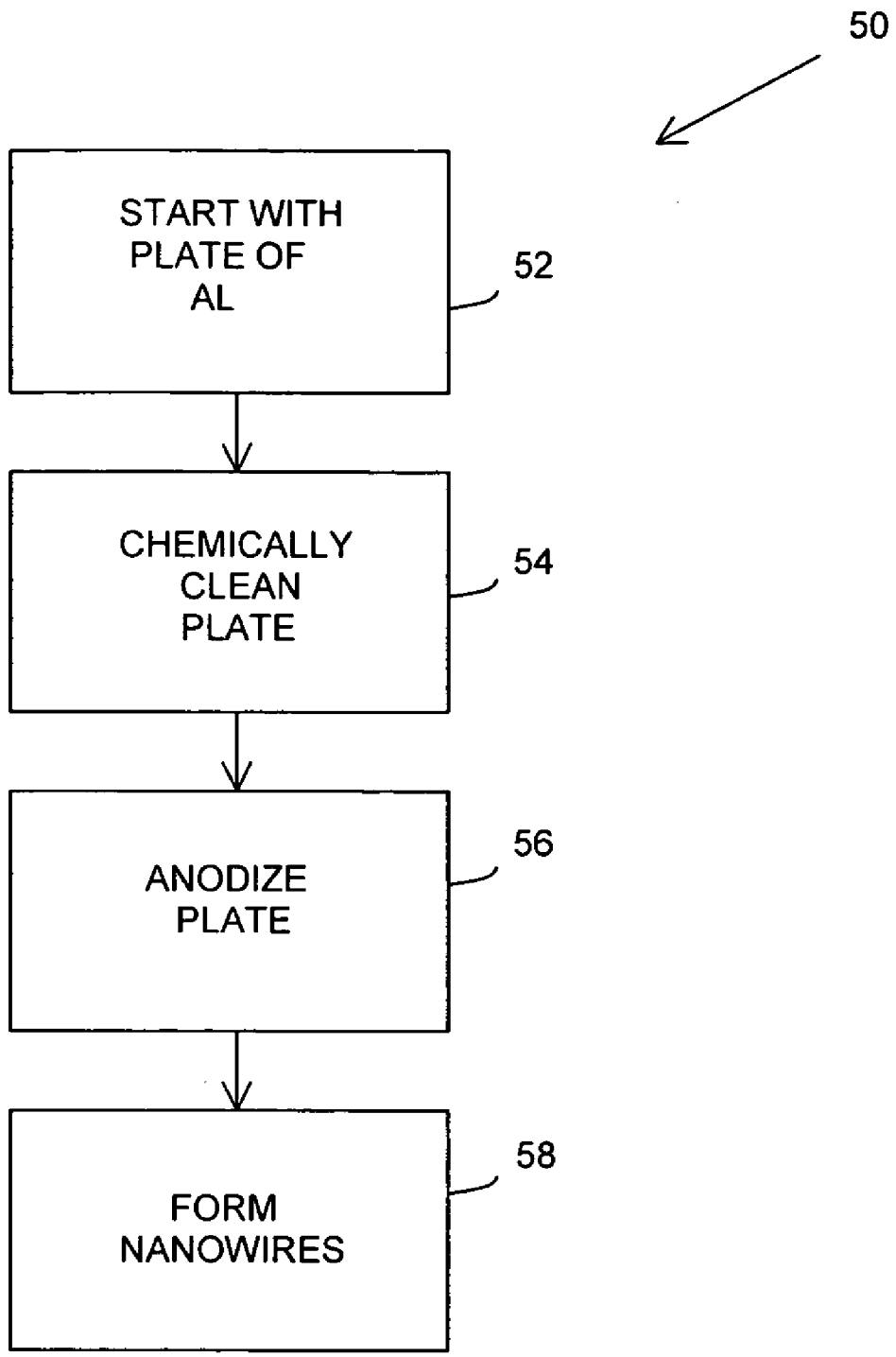
FIG. 4 is a flow chart of a fabrication procedure, in accordance with one embodiment of the invention, for forming the capacitor of FIG. 3, in accordance with one embodiment of the invention.

Referring to FIG. 4, a simplified flowchart of a procedure 50 of fabrication, in accordance with one embodiment of the invention, is shown which may be used to produce the capacitor of FIG. 3. It should be understood that other procedures also may be used to fabricate the high density capacitors shown herein of the various embodiments in accordance with the present invention. Likewise, the procedure 50, in accordance with one embodiment of the invention, also may be used to fabricate other embodiments of capacitors than those shown herein. At 52, the procedure 50 starts with the plate or foil of high purity aluminum. At 54, the aluminum plate is chemically cleaned to remove the native oxide on the surface. At 56, the aluminum plate is then anodized in an acid solution, typically sulfuric or phosphoric acid. Various concentrations of the acid, voltages, temperatures and times may be used. Under these conditions a porous, nearly periodic, structure is formed in the anodized aluminum plate, i.e., the AMO substrate as previously shown in FIGS. 1A and 2. At 58, the conductive material is deposited over the thin oxide layer of the surfaces of the AMO substrate, causing the conductive nanowires to be formed in the nanopores of the AMO substrate. Hence, the AMO substrate 10 may also be viewed as being a template for forming the nanowires.

Using conservative estimates of $10^{10}$ columns per $cm^2$, with an internal diameter of 70 nm and a length of 1 um, a capacitance density of approximately 10 $uF/cm^2$ may be achieved with aluminum (k~9.5) having an oxide thickness of 10 nm. This may be achieved with a plate having only 1 um thickness. The letter k refers to dielectric constant. Hence, it is contemplated that by use of the procedure of FIG. 4, it may be possible to increase the capacitance density by at least an order of magnitude. It also is contemplated that other metals, such as titanium or tungsten, may be used to form these substrates in place of aluminum, in which case even larger capacitance densities may be achieved due to their higher relative dielectric constants. In summary, one embodiment of the present invention, as shown in FIGS. 1-4, includes a novel capacitor technology that may provide volumetric capacitance densities substantially greater than most other technologies, for example, possibly greater than four times that of prior art ceramic embodiments, even though Barium Strontium Titinate (BST) of the ceramic embodiments may have a much greater dielectric constant.

Referring to FIGS. 5 and 6, there is illustrated an AMO substrate 70, after being anodized, intended for use in forming an array capacitor in accordance with another embodiment of the present invention. The AMO substrate 70 includes a core metal plate or foil 72, with a plurality of nanopores (not visible in FIGS. 5 and 6) passing through the metal plate 72 from the top side to the bottom side of the AMO substrate 70. Additionally, the AMO substrate 70 includes an oxide layer covering the top and bottom sides of the metal plate 72 and also the walls of the nanopores. The anodization process produces both the nanopores and the oxide layer. The formation of this array capacitor using the AMO substrate 70 to this point incorporates the topology previously described with respect to FIG. 1A. Additionally, the AMO substrate 70 has a plurality of spaced-apart protective layers or coatings 74 deposited on the metal plate 72 prior to the anodizing process. These protective coatings allow for small segments of the AMO substrate 70 not to be anodized. In other words, under these coatings 74 there will be no nanopores and no oxide layer. Instead, with the removal of at least a part of the protective coating 74 (e.g., center) after anodization, the underlying metal plate 72 may be accessed. The protective coatings 74 may be distributed in a uniformly pattern. The protective coatings may be formed by photoresist spun on the metal plate 72 or by screen printing of the metal plate 72. In this embodiment, the protective coating 74 may be distributed on both the top and bottom (both sides) of the AMO substrate 70. However, in other embodiments distributing the protective coatings 74 on only one side, or less than all of one side, may be desirable.

As shown in cross-sectional view of FIG. 7, the AMO substrate 70 of FIGS. 5 and 6 has a plurality of nanopores 76. Since the nanopores 76 form perpendicular to a top surface 78, they form columns within the unprotected areas 80 not shielded by the protective coatings 74, but do not form nanopores where the protective coatings 74 are positioned. Although the oxide layer is not visible, there also is no oxide layer under the protective coatings 70. More specifically, the AMO substrate 70 is coated with a thin, conformal, insulating oxide layer during the anodization process in the unprotected areas 80 but not in the protected areas under the protective coatings 74. Thereafter, a conductive material 84, such as a metal or electrically conductive polymer, may be deposited on the top and bottom surfaces of the AMO substrate 70. This forms a plurality of nanowires 82 within the nanopores 76. The conductive material 84 on the top and bottom of the AMO substrate may electrically interconnect the nanowires 82. Again, the metal plate 72 provides one terminal (i.e., anode) for the array capacitor and the conductive material 84 (i.e., cathode) provides the other terminal of the capacitor, with the oxide layer forming the insulating dielectric of the array capacitor. To expose the anode (metal plate 72), the center of the protective coatings 74 may be opened. Opening the protective coatings 74 may be through photo lithography if it is a photoresist. It is also contemplated that laser ablation may be another possibility for opening the protective coatings 74.

Figure 8:
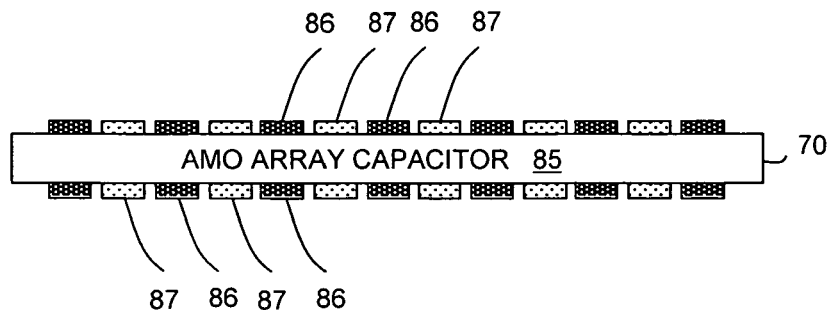
FIG. 8 is side view an AMO array capacitor, formed from the AMO substrate of FIGS. 5-7, in accordance with another embodiment of the present invention.

Referring to FIG. 8, an AMO array capacitor 85, formed from the AMO substrate 70 of FIGS. 5-7, is shown with a plurality of power terminals 86 and a plurality of ground terminals 87. The terminals 86 and 87 may be on both sides of the AMO array capacitor 85 as illustrated in FIG. 8. The power and ground terminals 86 and 87 may alternate. In one embodiment, the power terminals 86 may be electrically coupled to the metal plate, i.e., the anode. As previously described with respect to FIGS. 5-7, the electrical connections for the power terminals 86 may be established by opening the centers of the protective coatings disposed on the metal plate. The ground terminals 87 may be connected to the conductive material and the nanowires, i.e., cathode. In another embodiment, the power terminals 86 may be connected to the conductive material and the ground terminals 87 may be connected to the metal plate. In this manner, two groups of current paths are formed in the AMO array capacitor 85. The first group of current paths extends from a plurality of the power terminals 86 on one side of the array capacitor 85 to a plurality of the power terminals 86 on the other side of the array capacitor 85. The second group of current paths extends from a plurality of the ground terminals 87 on one side of the array capacitor 85 to a plurality of the ground terminals on the other side of the array capacitor 85. The two groups of current paths may be characterized as defining two conductive layer paths, one though the metal plate and one through the conductive material including the nanowires. The array capacitor 85 generates capacitance between these two conductive layer paths.

A large number of these current paths within the first and second groups provide for reduced inductance, which is especially beneficial when the paths are used for power supply lines for a die. The grid pattern, as best shown in FIG. 5, may be provided by alternating each of the current paths (alternating power and ground terminals 86 and 87) through the array capacitor 85. The alternating of the opposite direction current paths result in a further reduction of inductance due to the cancellation of inductance resulting from the mutual coupling of the opposite flowing current. Although the power and ground terminals 86 and 87 are shown on both sides of the AMO array capacitor 85, there may be applications where terminals on only one side may be desirable, as shown by an AMO array capacitor 90 in FIG. 9.

Figure 9:
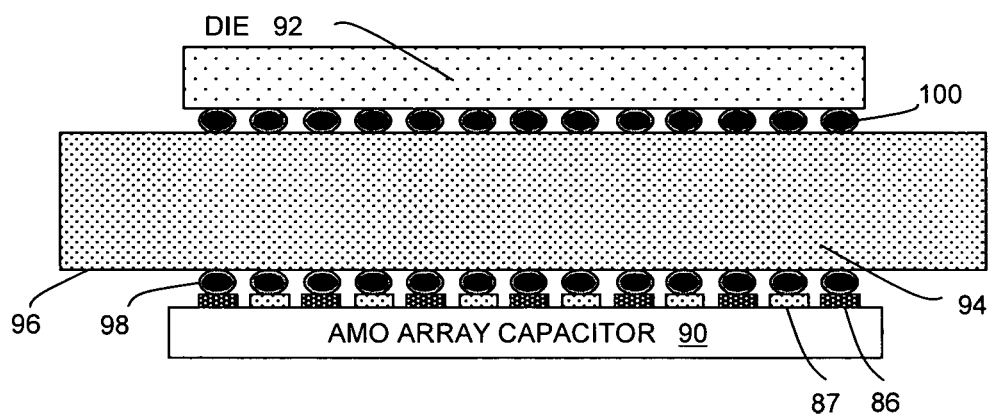
FIG. 9 is a side view of an electronic assembly using another AMO array capacitor in accordance with yet another embodiment of the invention.
Figure 10:
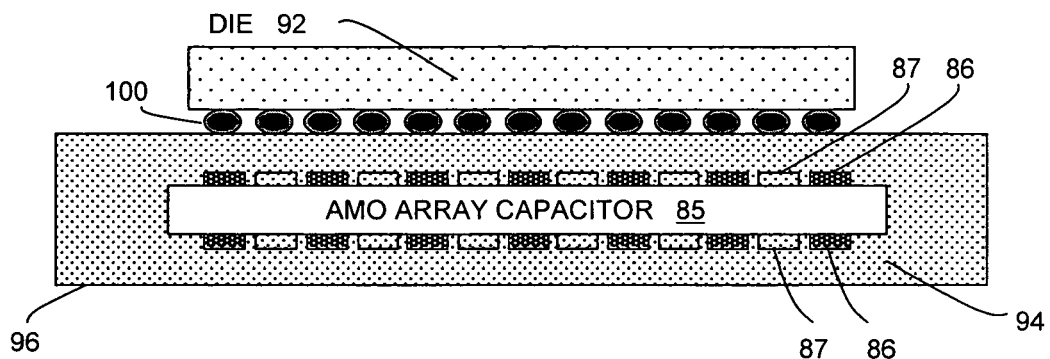
FIG. 10 is a side view of another electronic assembly having embedded therein the AMO array capacitor of FIG. 8.

Referring to FIGS. 9 and 10, the AMO array capacitor, according to the present invention, is incorporated into two illustrative electronic assemblies, each including a chip or die 92 and a chip carrier 94, with the chip 92 and the chip carrier 94 forming an integrated circuit (IC) package. The die 92 may be any integrated circuit die and, more specifically, may be a processor die. Further process steps are needed for attachment of the terminals 86 and 87 of the AMO array capacitor to the chip carrier 94. Two different methods of attachment are illustrated in the FIGS. 9 and 10. In FIG. 9, the AMO capacitor array 90 is attached to the land side surface 96 of the chip carrier 94 by a plurality of solder bumps 98 interposed between the terminals 86 and 87 and a plurality of land pads (not shown) mounted on the surface 96 of the chip carrier 94. The chip carrier 94 is connected to the die 92 by a plurality of solder bumps 100. In FIG. 10, the AMO array capacitor 85 is embedded or encapsulated in the chip carrier 94. The routing of the power and ground within the chip carrier 94 is not shown, but connections are made from the power and ground terminals 86 and 87 of the AMO array capacitor 85 to the die 92 via solder bumps 100. On the land side of the chip carrier 94, the terminals 86 and 87 are connected to a socket or motherboard (not shown).

With respect to FIGS. 8-10, the AMO arrays capacitors 85 and 90 comprise a single layer capacitor; however, multiple layers may be stacked to form even greater capacitance values. It is contemplated that this method may produce 10's perhaps even 100's of uf/cm$^2$ in a single layer. The higher capacitance density may allow use of cheaper discrete capacitors in the IC package for second droop and may potentially remove the need for additional second droop capacitors with the higher capacitance densities.

Figure 11:
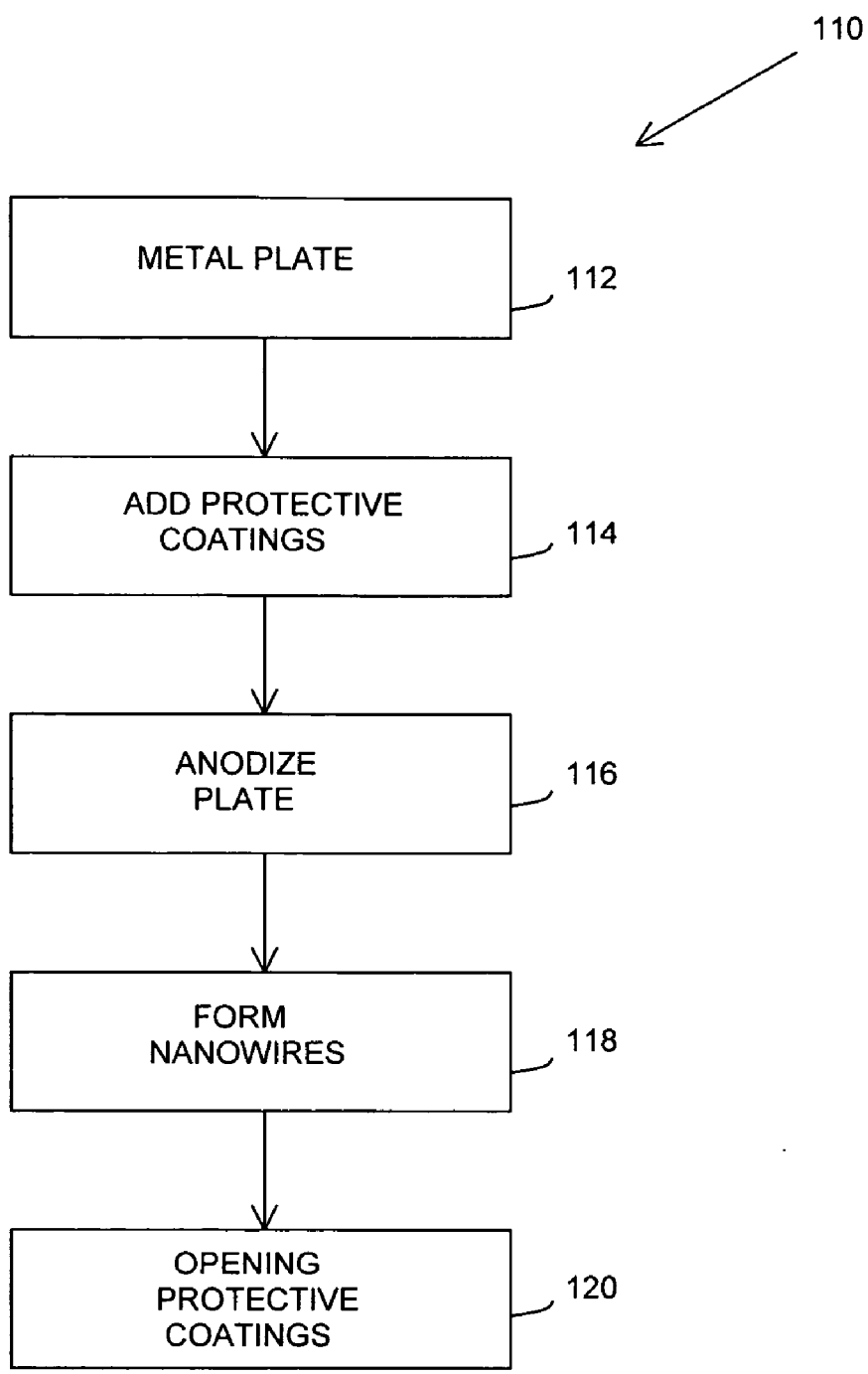
FIG. 11 is a flow chart of a fabrication process for making the AMO array capacitor of FIGS. 8 and 9 in accordance with another embodiment of the invention.

Referring to FIG. 11, a process 110 for forming the AMO array capacitors of FIGS. 8-10 is summarized in a flow chart. Assuming that the process starts with an already cleaned metal plate at 112, the protective coatings are added at 114 to the metal plate or foil. Thereafter, at 116 the metal plate is anodized to form a plurality of nanopores and an oxide layer in places where there are no protective coatings. Next, at 118, the conductive material is deposited on the AMO substrate to form nanowires in the nanopores and coat the sides of the AMO substrate. Next, at 120 the protective coatings are opened to expose the underlying metal plate so as to provide the power terminals. In another embodiment, the protective coatings may be opened to provide ground terminals.

Figure 12:
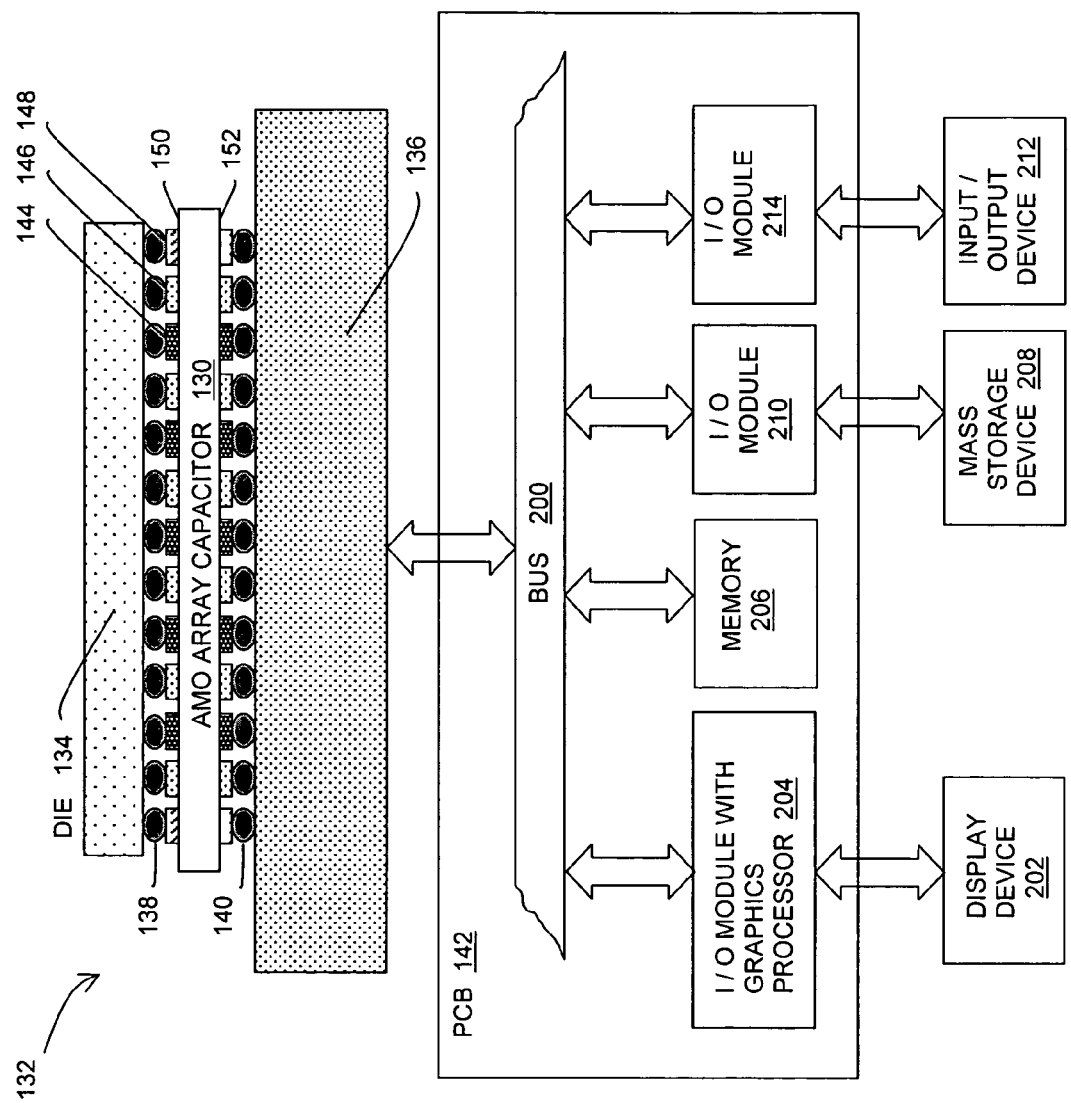
FIG. 12 is a cross-sectional view and block diagram of a system incorporating an AMO capacitor interposer in accordance with another embodiment of the invention.

Referring to FIG. 12, there is shown an AMO capacitor interposer 130 in accordance with another embodiment of the present invention. More specifically, the AMO capacitor interposer 130 is incorporated into an electronic assembly of an illustrative system 132. The electronic assembly includes the AMO capacitor interposer 130, an IC die (chip) 134, and a chip carrier 136. The AMO capacitor interposer 130 is interposed between an IC die 134 and a chip carrier 136. Solder bumps 138 are used to provide electrical connections between the AMO capacitor interposer 130 and the die 134. Solder bumps 140 are used to provide electrical connections between the AMO capacitor interposer 130 and the chip carrier 136. Solder bumps 138 and 140 are sometimes referred to as C4 bumps because this style of interconnection is used in controlled collapse chip connection (i.e., C4) packaging. The chip carrier 136 is attached to a printed circuit board (PCB) 142 by solder balls (not shown). In this way electrical connection between IC die 134 and PCB 142 is made through the AMO capacitor 130.

The AMO capacitor interposer 130 may include, on both sides thereof, a plurality of power terminals 144, a plurality of ground terminals 146, and a plurality of input/output (I/O) signal terminals 148. The conductive paths (not shown) of the power and ground terminals 144 and 146 may serve as the power supply paths for the IC die 134. These conductive paths are electrically isolated from I/O signal paths. In one embodiment, the terminals 144, 146, and 148 may be disposed on opposed surfaces 150 and 152 of the AMO capacitor interposer 130. The power and ground terminals 144 and 146 may be formed in the same manner as was described in FIG. 11. The side of interposer 130 that is populated with the solder bumps 138 may be referred to as the chip-side. The side of interposer 130 that is populated with the solder bumps 140 may be referred to as the bottom-side.

The capacitor interposer 130 may have a low profile and may be a high density capacitor. This capacitor interposer 130 may produce 10's perhaps even 100's of uf/cm2 in a single layer. The higher capacitance density may allow use of cheaper discrete capacitors on the chip carrier 136. The capacitance of the interposer 130 may be used as a decoupling capacitor. The need for such capacitance increases as the switching speed and current requirements of the IC die 134 become higher. By placing a decoupling capacitor closer to the IC die 134, the undesirable parasitic inductance associated with the leads is substantially reduced.

Additional process stages to those shown in FIG. 11 may be needed for fabricating the I/O signal conductors 148. One process for fabricating the I/O conductors 148 is to pre-form the I/O holes or tubes for the I/O signal conductors. For example, deep-vias (not shown) may be formed in the metal plate prior to anodization, with such deep-vias extending from one side to the other side of the metal plate in traversing relationship. When putting on the protective coatings for the anode terminals prior to anodization, the protective coatings may also be applied around the I/O holes as well. Hence, one group of the protective coatings is for the terminal connections to the metal plate and the other group is for the I/O holes or vias. Then, during the formation of the nanowires, the I/O connections may be formed as well, with both being formed with the same conductive material.

Referring to FIGS. 13A-D, another process for fabricating the I/O signal conductors 148 of FIG. 12 is illustrated. A first group of protective coatings may be placed on the metal plate for the formation of the anode terminals and a second group of protective coatings may be placed in areas where the I/O signal connections are desired. These protective coatings may be spaced-apart from each other. Next, the centers of the protective coatings for the I/O connections only may be opened up to form centrally-located openings, while leaving alone the other protective coatings for the metal plate (anode terminals). The opening in each of the protective coatings leaves an unprotected area of the metal plate that may be exposed to anodization. Next, during the anodization process, the holes (nanopores caused by the anodization) for the I/O conductors may be formed in the metal plate in the unprotected areas of the centrally-located openings (I/O area), as well as forming nanopores in the cathode area. Thereafter, the nanowires may be formed in the I/O area and the cathode area with the deposit of a conductive material. The FIGS. 13A-D illustrates only a small portion of the substrate that surround a via formed by this process.

Referring to FIG. 13A, the process flow for forming the I/O signal holes or vias may start with a metal plate or substrate 160, such as aluminum. Alternatively, one of the other previously-mentioned metals may be used. In FIG. 13B, a photoresist layer 162 may be applied to the metal substrate, using spinning for example. In FIG. 13C, the photoresist layer is masked, exposed and resist-removed to form a plurality of protective coatings 164 (only one illustrated) deposited on the metal substrate 160, with there being a protected area of the metal plate 160 under each protective coating 164 which is protected from anodization. In one embodiment, each of the protective coatings 164 may have a ring-like or annular configuration. However, other shapes may be formed. The inner dimensions of each of the protective coatings 164 forms a centrally-located opening 165, with the opening 165 defining an inner unprotected area 166 of the metal plate 160 which is exposed to the anodization. The outer dimensions of each of the protective coatings 164 define an outer unprotected area 168 which also is exposed to the anodization. In FIG. 13D, the metal substrate may be anodized to form the nanopores in the unprotected areas 166 and 168. The nanopores of the inner unprotected area 166 may be used to form I/O signal vias or holes and the nanopores of the outer unprotected area 168 may be used to form the cathode of the capacitor. During anodizing, oxide is formed on the walls of the nanopores. This oxide may provide isolation between the nanopores of unprotected area 166 and the nanopores of the unprotected area 168. In one embodiment, these nanopores may be used as formed with the nanowires being grown inside the nanopores to form the electrical connections for the via. Referring back to FIG. 12, forming the nanowires may then provide electrical paths through the AMO substrate from surface 150 to surface 152 for the I/O conductors 148 and through the cathode, but the two groups of nanowires are electrically isolated. Thereafter, the process may be similar to the previously described process where the openings for the anode may be formed.

Referring to FIGS. 14A-H, yet another approach for fabricating the I/O signal conductors 148 of FIG. 12 is shown. Moreover, the process flow shown in FIGS. 14A-H may provide an alternative to the flow process shown in FIG. 11 and may be used to fabricate any of the various embodiments of FIGS. 1-12. This process may provide additional control of the placement of vias for I/O signal interconnects and/or cathode connections. Additionally, oxide on the surface of the nanopores may be of an improved quality and a controlled thickness, and the nanopores themselves may not be as brittle as may exist with the previously described fabrication process. Referring to FIG. 14A, the process flow may start with a metal plate or substrate 170, such as aluminum. Alternatively, one of the other previously-mentioned metals may be used. In FIG. 14B, a photoresist layer may be applied to the metal substrate, using spinning for example, to form a protective coating 172. To this point, the process may be the same as described with respect to the process of FIGS. 13A-D.

In FIG. 14C, photolithography may be used to form a plurality of openings 173 in the protective coating 172. Each opening 173 may define or outline an unprotected areas 174 of the metal plate 170 which may be exposed anodization. More specifically, the protective coating 172 (e.g., photoresist layer) may be masked, exposed and resist-removed to form a pattern of spaced-apart openings 173 (and therefore unprotected areas 174), such as the illustrative pattern shown in FIG. 14C. In one embodiment, the unprotected areas 174 may be uniformly distributed. The area of the metal plate 170 under the remaining protective coating 172 not removed may be defined as being a protected area of the metal plate 170 (not visible in FIG. 14C).

In the process flow described with respect to FIGS. 13A-D, there are areas protected from anodization (under the protective coatings 164 in FIG. 13C), but everywhere outside of these areas (outer unprotected area 168 in FIG. 13C) is an unprotected area that was anodized to form the cathode. In the process shown in FIGS. 14A-H, the unprotected areas 174 may be used not only for forming vias for I/O signal connections, but also to form the cathode. Hence, this defines two groups of openings 173 and unprotected areas 174: one group for the I/O connections and one for the cathode. In FIG. 14C, only circular openings 173 for the unprotected areas 174 are shown, but these opening 173 may be of any shape and size.

In FIG. 14D, the metal plate 170 may be anodized and nanopores may be formed through the metal plate 170 only in the unprotected areas 174. One of the unprotected areas 174 of FIG. 14D is enlarged and shown in FIG. 14E to illustrate that multiple nanopores 178 are formed within each unprotected area 174. More specifically, the light region is the nanopores 178 and the dark region is aluminum oxide ($Al_2O_3$) 180. The unprotected areas 174 may be brittle, in that the unprotected areas 174 contain aluminum oxide ($Al_2O_3$). Additionally, the control of this oxide growth may be difficult.

Another departure from the previously-described process flow described with respect to FIGS. 13A-D is this shown in FIG. 14F. In FIG. 14F, the aluminum oxide in the unprotected areas 174 may be removed using, for example, a base solution. An enlargement of a dashed portion of FIG. 14F is shown in FIG. 14G, which shows the aluminum oxide removed from these particular unprotected areas 174 to form single, enlarged nanopores 182. These enlarged nanopores 182 may be used both for the I/O connections and for the cathode.

At this point in the process flow of FIGS. 14A-H, there may be two alternative paths for continuing the process. With respect to FIG. 14G, the protective coating or photoresist layer 172 may be left on the metal plate as shown in FIG. 14G. Alternatively, the protective coating 172 may be removed (removal not shown), leaving a clean metal substrate. In either case, the result is that the single enlarged nanopore 182 may be produced in each of the unprotected areas 174. The enlarged nanopore 182 may have an inner wall 184 which is not oxidized. In FIG. 14H, the next phase of the process flow is to repeat the anodization process to form an oxide layer 186 on the wall 184 of the enlarged nanopore 182. This second anodization may allow for better controlled oxide growth on the walls 184.

The remaining process phases may be similar to the previously described process flow: nanowires may be grown inside the enlarged nanopores 182, electrical contacts may be formed with the nanowires, and a second group of openings (not shown) may be opened up through the protective coating 172 to expose bare metal which is used to form the anode connections. Hence, before anodization, the first group openings 173 in the protective coating 172 may be made to form nanopores for the I/O connections and the cathode. After anodization, a second group of openings (not shown) may be made in the protective coating 172 to form a plurality of anode terminals.

In summary, the process described in FIGS. 14A-H may control the formation of nanopores (placement and size) and the thickness of the insulating oxide growth for AMO capacitors. This control may allow placement of connections for power, ground and I/O signals and may provide for a more uniform oxide growth on the walls of the nanopores. Photolithography may be used to form unprotected areas to be exposed to anodization so as to form nanopores for cathode and/or the I/O signal connections; the oxide may be removed in the unprotected areas to provide enlarged nanopores with walls formed of bare metal; and a second anodization may control the oxide growth on the walls of the nanopores so as to provide insulated vias for deposited nanowires. By controlling the positions and sizes of the nanopores, connections to nanowires in the nanopores may be easier. By controlling the thickness of the oxide growth on the walls of the nanopores, a higher capacitance density may be possible since the resulting oxide may be more uniform and may be of a better quality (e.g., less leaky).

Figure 15:
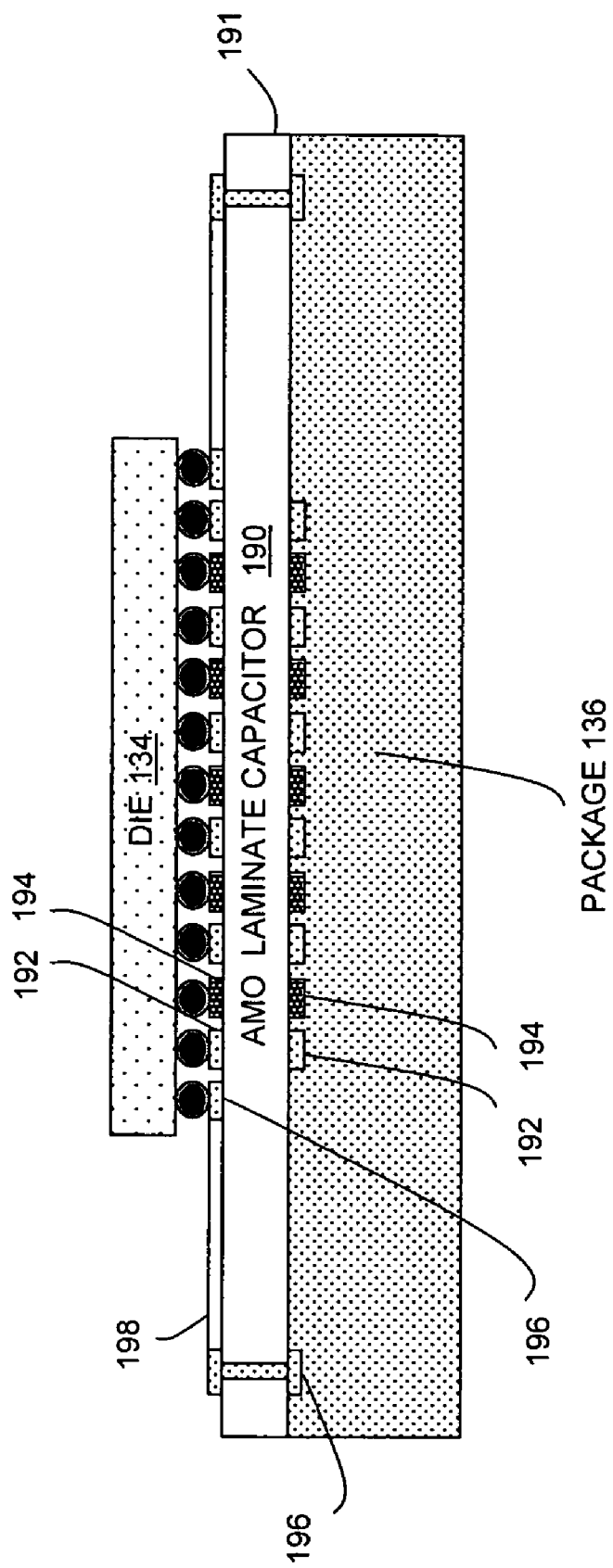
FIG. 15 is a cross-sectional block diagram of an electronic assembly including an AMO laminate capacitor according to another embodiment of the present invention.

Referring to FIG. 15, there is shown an electronic assembly including an alternative embodiment of the interposer shown in FIG. 12. In this alternative embodiment, an AMO laminate capacitor 190 forms an interposer disposed between the die 134 and a chip carrier 136 of FIG. 12. The AMO laminate capacitor 190 may be an integral part of a laminated capacitor layer 191 which is laminated onto the die side of the chip carrier 136. This AMO laminate capacitor 190 is substantially similar to the AMO array capacitor 130 of FIG. 12, except it is formed in the laminated capacitor layer 191 on the chip carrier 136. Also, in one embodiment, the I/O signal terminals may extended to the peripheral region of the laminated capacitor layer 191 relative to a central region of the laminated capacitor layer 191 having the power and ground terminals. More specifically, the laminated capacitor layer 191 may include a plurality of power terminals 192, a plurality of ground terminals 194, and a plurality of I/O signal terminals 196 on opposed sides of the laminated capacitor layer 191. In one embodiment, the power and ground terminals 192 and 194 may alternate in the central region of the laminated capacitor layer 191 and the I/O signal terminals 196 may be disposed in a peripheral area of the laminated capacitor layer 191, with I/O signal terminals on opposed sides of the laminated capacitor layer 191 being coupled by trace routings 198. In one embodiment, the trace routings 198 may be disposed on the die side of the laminated capacitor layer 191.

In one embodiment, the power terminals 192 may be electrically coupled to the metal plate (metal core 22 in FIGS. 5-7), which forms the anode of the capacitor 190. The ground terminals 194 may be connected to the conductive material and the nanowires (conductive material 30 and nanowires 32 in FIGS. 5-7), which form the cathode of the AMO laminate capacitor 190. In another embodiment, the power terminals may be coupled to the conductive material and the ground terminals may be coupled the metal plate. In this manner, the two groups of current paths are formed in the AMO laminate capacitor 190. The first group of current paths extends from a plurality of the power terminals 192 on one side of the capacitor 190 to a plurality of the power terminals 192 on the other side of the capacitor 190. The second group of current paths extends from a plurality of the ground terminals 194 on one side of the capacitor 190 to a plurality of the ground terminals 194 on the other side of the capacitor 190. These two groups of current paths may be characterized as defining two conductive layer paths, one though the metal plate and one through the conductive material including the nanowires. Capacitance is established between these two conductive layer paths.

In FIG. 15 the I/O signal paths are shown routed outward from the die 134 using the traces 198; however, they may pass directly through the metal plate, as described with respect to FIG. 12. Although only a single laminated capacitor layer 191 is shown on the top (die side) of the chip carrier 136, multiple laminated capacitor layers 191 may be used. Additionally, laminated capacitor layers 191 may be used on both sides (top and bottom) of the chip carrier 136. In addition to having the laminated layer 191 on the outer layers of the chip carrier 136, the laminated layer 191 may also be embedded in the chip carrier 136. In other words, other layers may be laminated either below or above the laminated capacitor layer 191 that are not part of the capacitor 190, but are used for routing signals, power and ground planes. Via connections through the chip carrier 136 from top to bottom are not shown in FIG. 15.

The laminated layer 191 containing the AMO capacitor 190 may be applied as a build-up layer that may be laminated onto the chip carrier 136 so that it becomes part of the chip carrier 136. The laminated layer 191 and the chip carrier 136 may be sandwiched together and laminated under heat and pressure. Lamination may be conducted in a press at a temperature of about 150 degrees C. to about 300 degrees C. for about 30 to about 120 minutes.

As previously described with respect to the embodiment of FIG. 12, in fabricating the capacitor 190, protective areas may be formed by photoresist spun on and patterned or by screen printing in the desired regions. The metal substrate is then anodized. The electrical connections for the power terminals 192 may be established by opening the centers of the protective coatings to expose the metal plate. In addition, these protected areas may allow for formation of vias to pass I/O signals through the metal plate. Alternatively, the fabrication process flow of FIGS. 13A-H may be used.

Referring back to FIG. 12, the system 132 illustrates one of many possible systems in which the various embodiments, according to the present invention, may be incorporated. In FIG. 12, the AMO capacitor interposer 130 is shown incorporated into the system 132. However, the system 132 also may include the electronic assemblies of FIGS. 9 and 10 with the chip 92, the chip carrier 94 and the AMO array capacitor 90 or 85 respectively, instead of the illustrated electronic assembly shown in FIG. 12, which includes the die (chip) 134, the chip carrier 136 and the AMO interposer 130. Likewise, as already described, the system 132 may include the electronic assembly of FIG. 15, which includes the AMO laminate capacitor 190. In this illustrative electronic assembly shown in FIG. 12, the IC die 134 may be a processor die and PCB 142 may be a motherboard. In addition to the chip carrier 136, the motherboard PCB 142 may have mounted thereon a main memory 206 and a plurality of input/output (I/O) modules for external devices or external buses, all coupled to each other by a bus system 200 on the motherboard PCB 142. More specifically, the system 132 may include a display device 202 coupled to the bus 200 by way of an I/O module 204, with the I/O module 204 having a graphical processor and a memory. The I/O module 204 may be on the PCB 142 as shown in FIG. 12 or on a separate expansion board. The system 132 may further include a mass storage device 208 coupled to the bus 200 via an I/O module 210. Another I/O device 212 may be coupled to the bus 200 via an I/O module 214. Additional I/O modules may be included for other external or peripheral devices or external buses.

Examples of the memory 206 include, but are not limited to, static random access memory (SRAM) and dynamic random access memory (DRAM). Examples of the mass storage device 208 include, but are not limited to, a hard disk drive, a compact disk drive (CD), a digital versatile disk driver (DVD), a floppy diskette, a tape system and so forth. Examples of the input/output devices 212 may include, but are not limited to, devices suitable for communication with a computer user (e.g., a keyboard, cursor control devices, microphone, a voice recognition device, a display, a printer, speakers, and a scanner) and devices suitable for communications with remote devices over communication networks (e.g., Ethernet interface device, analog and digital modems, ISDN terminal adapters, and frame relay devices). In some cases, these communications devices may also be mounted on the PCB 142. Examples of the bus system 200 include, but are not limited to, a peripheral control interface (PCI) bus, and Industry Standard Architecture (ISA) bus, and so forth. The bus system 200 may be implemented as a single bus or as a combination of buses (e.g., system bus with expansion buses). Depending upon the external device, internal interfaces of the I/O modules may use programmed I/O, interrupt-driven I/O, or direct memory access (DMA) techniques for communications over the bus 200. Depending upon the external device, external interfaces of the I/O modules may provide to the external device(s) a point-to point parallel interface (e.g., Small Computer System Interface —SCSI) or point-to-point serial interface (e.g., EIA-232) or a multipoint serial interface (e.g., FireWire).

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An electronic assembly, comprising:
   an integrated circuit chip; and
   a capacitor coupled to the intergated circuit chip, the capacitor comprising:
      a metal plate including at least an anodized portion having a surface with a plurality of nanopores; an oxide layer formed on the surface and in the plurality of nanopores; and a metal core;
      a plurality of nanowires disposed in the plurality of nanopores;
      a conductive layer formed on the surface and attached to the plurality of nanowires;
      at least one first terminal electrically coupled to the metal core;
      at least one second terminal electrically coupled to the conductive layer;
      a plurality of protective coatings formed on the core metal and disposed within the anodized portion;
      the at least one first terminal includes a plurality of the first terminals formed within a plurality of openings in the protective coatings; and
      the at least one second terminal includes a plurality of the second terminals disposed on the conductive layer.

2. The electronic assembly according to claim 1, wherein the plurality of protective coatings are uniformly distributed on the surface of the anodized portion.

3. An electronic assembly comprising:
an integrated circuit chip; and
a capacitor coupled to the integrated circuit chip, the capacitor comprising:
- a metal plate including at least an anodized portion having a surface with a plurality of nanopores; an oxide layer formed on the surface and in the plurality of nanopores; and a metal core;
- a plurality of nanowires disposed in the plurality of nanopores;
- a conductive layer formed on the surface and attached to the plurality of nanowires;
- at least one first terminal electrically coupled to the metal core;
- at least one second terminal electrically coupled to the conductive layer;
- a protective coating formed on the metal core and disposed within the anodized portion, with the protective coating including a first plurality of openings arranged to expose the metal core with each of the first plurality of openings containing a signal via;
- the protective coating including a second plurality of openings arranged to expose the metal core, with the at least one first terminal includes a plurality of the first terminals formed within the second plurality of openings; and
- the at least one second terminal includes a plurality of the second terminals disposed on the conductive layer.

4. The electronic assembly according to claim 3, wherein the first plurality of openings are uniformly distributed on the surface of the anodized portion.

5. An electronic assembly, comprising:
an integrated circuit chip; and
a capacitor coupled to the integrated circuit chip, the capacitor comprising:
- a metal plate including at least and anodized portion having a surface with a plurality of nanopores; an oxide layer formed on the surface and in the plurality of nanopores; and a metal core;
- a plurality of nanowires disposed in the plurality of nanopores;
- a conductive layer formed on the surface and attached to the plurality of nanowires;
- at least one first terminal electrically coupled to the metal core;
- at least one second terminal electrically coupled to the conductive layer; and wherein the metal plate comprises an anodic metal oxide substrate having a metal core, a pair of opposed surfaces with the plurality of nanopores disposed to extend between the opposed surfaces and to traverse the metal core; and an oxide layer formed on the opposed surfaces and in the plurality of nanopores.

6. The electronic assembly according to claim 5, further comprising:
- a plurality of protective coatings formed on the metal core and disposed on the pair of opposed surfaces;
- the at least one first terminal includes a plurality of the first terminals formed within a plurality of openings in the protective coatings; and
- the at least one second terminal includes a plurality of the second terminals disposed on the conductive layer.

7. The electronic assembly according to claim 5, further comprising:
- a protective coating formed on the metal core and disposed on the pair of opposed surfaces, the protective coating including a first plurality of openings arranged to expose the metal core with each of the first plurality of openings containing a signal via;
- the protective coating including a second plurality of openings arranged to expose the metal core, with the at least one first terminal includes a plurality of the first terminals formed within the second plurality of openings; and
- the at least one second terminal includes a plurality of the second terminals disposed on the conductive layer.

8. The electronic assembly according to claim 7, wherein an input/output conductor is disposed in each of the signal vias.

9. The electronic assembly according to claim 1, further comprising a chip carrier coupled to the integrated circuit chip and the capacitor.

10. The electronic assembly according to claim 3, further comprising a chip carrier coupled to the integrated circuit chip and the capacitor.

11. The electronic assembly according to claim 5, further comprising a chip carrier coupled to the integrated circuit chip and the capacitor.

12. The electronic assembly according to claim 5, further comprising a laminated layer including the capacitor; and the laminated layer being laminated to the chip carrier.

* * * * *